United States Patent
Pütz et al.

(10) Patent No.: US 12,092,187 B2
(45) Date of Patent: Sep. 17, 2024

(54) DEVICE COMPRISING AN ENERGY CHAIN AND A SLIDING TABLE

(71) Applicant: TSUBAKI KABELSCHLEPP GMBH, Wenden-Gerlingen (DE)

(72) Inventors: Peter Pütz, Olpe (DE); Daniel Berger, Siegen (DE); Werner Eul, Troisdorf (DE)

(73) Assignee: Tsubaki Kabelschlepp GmbH, Wenden-Gerlingen (DE)

( * ) Notice: Subject to any disclaimer, the term of this patent is extended or adjusted under 35 U.S.C. 154(b) by 264 days.

(21) Appl. No.: 17/639,375

(22) PCT Filed: Aug. 27, 2020

(86) PCT No.: PCT/EP2020/074006
§ 371 (c)(1),
(2) Date: Mar. 1, 2022

(87) PCT Pub. No.: WO2021/043668
PCT Pub. Date: Mar. 11, 2021

(65) Prior Publication Data
US 2022/0268338 A1     Aug. 25, 2022

(30) Foreign Application Priority Data
Sep. 2, 2019   (DE) .................. 20 2019 104 826.3

(51) Int. Cl.
*F16G 13/16*     (2006.01)
*H02G 11/00*     (2006.01)
*H03K 17/945*    (2006.01)

(52) U.S. Cl.
CPC .......... *F16G 13/16* (2013.01); *H02G 11/006* (2013.01); *H03K 17/945* (2013.01)

(58) Field of Classification Search
CPC ..... F16G 13/16; H02G 11/006; H03K 17/945
See application file for complete search history.

(56) References Cited

U.S. PATENT DOCUMENTS

2013/0008143 A1*   1/2013   Komiya ............... H02G 11/006
                                                              59/78.1
2015/0303665 A1    10/2015  Kemper
(Continued)

FOREIGN PATENT DOCUMENTS

| CN | 1734226 A   | 2/2006 |
|----|-------------|--------|
| CN | 104919208 A | 9/2015 |
| CN | 104919209 A | 9/2015 |

(Continued)

OTHER PUBLICATIONS

English translate (DE202018100339U1), Feb. 1, 2024.*
(Continued)

*Primary Examiner* — Mohammed S. Alawadi
(74) *Attorney, Agent, or Firm* — BainwoodHuang

(57) ABSTRACT

Techniques involve a device which includes an energy chain and a sliding table, the energy chain having a plurality of sliding shoes, each having a sliding surface for sliding on the sliding table. The sliding shoes each have a detection element, which is spaced from the corresponding sliding surface by a wearing layer. The sliding table has a sensor for determining the distance (d) between the sensor and the detection elements.

12 Claims, 1 Drawing Sheet

(56) References Cited

U.S. PATENT DOCUMENTS

Figure 1:
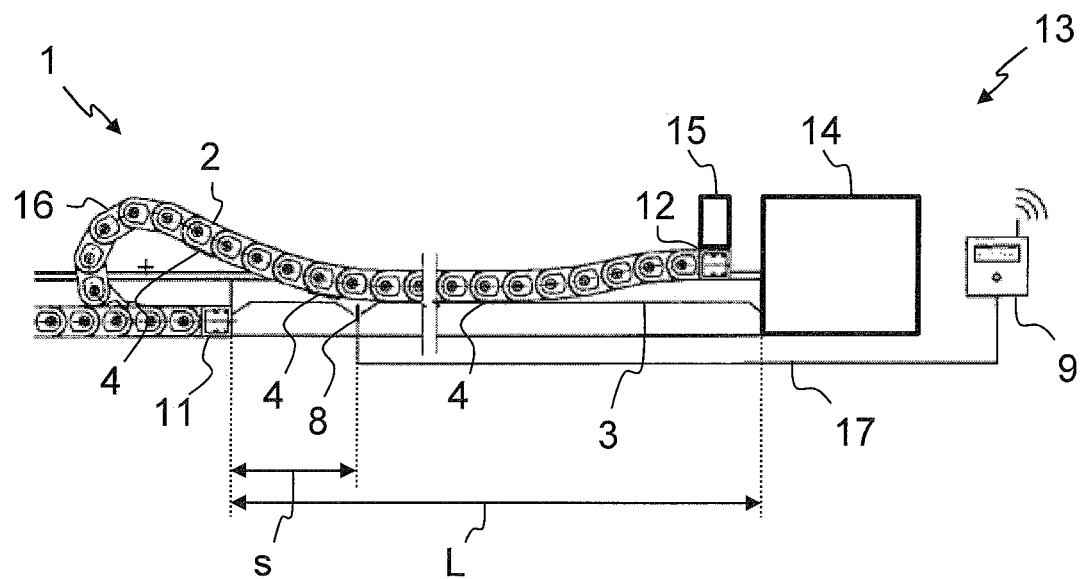

2019/0040935 A1* 2/2019 Hermey ................ F16L 3/015
2021/0151973 A1* 5/2021 Habering ................ F16G 13/16

FOREIGN PATENT DOCUMENTS

| | | | |
|---|---|---|---|
| CN | 105584546 A | 5/2016 | |
| CN | 109690097 A | 4/2019 | |
| DE | 19647322 A1 | 5/1998 | |
| DE | 202017102410 U1 | 7/2017 | |
| DE | 102016006061 A1 | 11/2017 | |
| DE | 202018100339 U1 * | 5/2019 | ............ F16G 13/16 |
| DE | 202018102239 U1 | 5/2019 | |
| EP | 1521015 A2 | 4/2005 | |
| EP | 3408561 B1 | 7/2020 | |
| WO | 2007121716 A1 | 11/2007 | |
| WO | 2017129805 A1 | 8/2017 | |

OTHER PUBLICATIONS

Machine Translation of Notice of Opposition of EP4025807; filed Feb. 29, 2024.
Notice of Opposition of EP4025807; filed Feb. 29, 2024.
Energiefuhrung aus kunstastoff Enerfiefuhrungen aus Stahl traxline cables for motion Fuhrungsbahnschutz-systeme Forder-Systeme (Reference F1 of Notice of Opposition of EP4025807).
Igus. eketten und-systemse. 4.2013.plastics for longer life (Reference F2 of Notice of Opposition of EP4025807).
Auszug aus dem,, Handbuch zur Aushwahl & Montage fur e-kettensysteme von igus, der Igus GmbH Ausgabe 2017 (Reference F3 of Notice of Opposition of EP4025807).

* cited by examiner

DEVICE COMPRISING AN ENERGY CHAIN AND A SLIDING TABLE

According to the invention, a device comprising an energy chain and a sliding table is proposed. The invention furthermore relates to an arrangement which comprises the device. The invention also relates to a control unit which is suitable for the device and to a computer program which is suitable therefor, as well as to a machine-readable storage medium with this computer program.

Energy chains with which cables and hoses can be guided between bodies that are movable relative to one another are known from the prior art. In general, energy chains are configured in such a way that parts of them slide on a sliding table. In order to facilitate the sliding, it is known to fit sliding shoes on energy chains. The sliding shoes have a sliding surface, with which they can slide over the sliding table.

During the use of the energy chain, wearing of the sliding shoes occurs. The sliding shoes therefore need to be changed regularly. Determination of the wear of the sliding shoes according to the prior art is complicated. This may on the one hand lead to the sliding shoes being changed too frequently, so that unnecessarily high costs and unnecessarily high maintenance outlay are incurred. On the other hand, it may lead to the exceeding of a wear limit not being identified promptly, so that damage to the energy chain and/or to the sliding table may occur.

On the basis thereof, the object of the present invention is to at least partially overcome the problems known from the prior art and in particular to provide a device comprising an energy chain and a sliding table in which the wear of sliding shoes can be determined particularly simply and reliably. A corresponding arrangement, a corresponding control unit, a corresponding computer program and a corresponding machine-readable storage medium are furthermore intended to be proposed.

These objects are achieved by the features disclosed herein. Further advantageous configurations of the invention disclosed herein. The features mentioned individually may be combined with one another in a technologically expedient way and may define further configurations of the invention.

According to the invention, a device comprising an energy chain and a sliding table is proposed. The energy chain has a plurality of sliding shoes with a respective sliding surface for sliding on the sliding table. The sliding shoes respectively have a detection element which is arranged separated from the corresponding sliding surface by a respective wearing layer. The sliding table has a sensor for determining a respective distance between the sensor and the detection elements.

With the energy chain, cables and hoses can be guided between bodies that are movable relative to one another. To this end, the energy chain may for example be constructed from a multiplicity of links connected to one another in an articulated fashion.

At least a part of the energy chain can slide along the sliding table. The sliding table is not part of the energy chain. The sliding table is preferably static.

That the first body is static means that it is employed in the usual regard for the definition of a reference system. The first body is to be understood as the larger of the two bodies. For example, in the case of a crane with a trolley, the crane is regarded as static and the trolley is regarded as movable. The crane in the example is the first body and the trolley is the second body. The sliding table is preferably connected to the first body. The sliding table is static in the same way as the first body.

The sliding table is not part of the energy chain. This means in particular that the lower run of the energy chain is not formed by the lower run. The sliding table is preferably—unlike the energy chain—not variable by displacement of the movable end of the energy chain relative to the fixed end of the energy chain. Consequently, there is no need to form the sliding table from links. In order to simplify the design, it is therefore preferred for the sliding table not to be formed from links connected to one another in an articulated fashion.

Preferably, the energy chain is arranged between a static first body and a second body, which is movable relative thereto. In that case, the sliding table is preferably connected to the first body.

The energy chain has a multiplicity of sliding shoes so that the energy chain can slide particularly well over the sliding table. Correspondingly, the sliding shoes are preferably arranged in such a way on the energy chain that the sliding shoes can be brought in contact with the sliding table. A different number of the sliding shoes may be in contact with the sliding table, depending on the setting of the energy chain. This number may be varied by displacing the second body relative to the first body.

Each of the sliding shoes has a respective sliding surface with which the sliding shoe can slide over the sliding table. The sliding surface delimits a wearing layer of the sliding shoe. The sliding shoe may thus be in contact with the sliding table via the wearing layer. The wearing layer is eroded over time by friction between the wearing layer and the sliding table, i.e. its thickness decreases. This is to be understood here as wear. The determination of the wear of a sliding shoe thus consists in determining the thickness of the wearing layer. As soon as the thickness of the wearing layer falls below a limit value, the sliding shoe needs to be replaced. The wearing layer is preferably formed from a plastic.

With the described device, the wear of the sliding shoe can be determined particularly simply and reliably. This is possible because of the detection elements of the sliding shoes and the sensor of the sliding table. If a sliding shoe is in contact with the sliding table in the region of the sensor, the wearing layer of this sliding shoe is arranged between the corresponding detection element and the sensor. The distance between the detection element and the sensor is therefore a measure for the thickness of the wearing layer, and to that extent for the wear of the sliding shoe. The wearing layer may extend precisely between the detection element and the sensor. In that case, the distance between the detection element and the sensor is exactly equal to the thickness of the wearing layer. It is, however, possible for a respective distance to be formed between the wearing layer and the detection element and/or between the wearing layer and the sensor. Such a distance may be subtracted as an offset from the distance between the detection element and the sensor in order to obtain the thickness of the wearing layer. The detection element may, for example, be arranged adjacent to a layer of plastic. In that case, the entire plastic layer is the wearing layer. The detection element may, however, also be set into a layer of plastic. In that case, only the part of the plastic layer which extends between the detection element and that surface of the plastic layer which is used as a sliding surface is to be regarded as the wearing layer.

According to one preferred embodiment, the device furthermore has a control unit which is adapted to determine a wear of the wearing layers of the sliding shoes from the measured values of the distance between the sensor and the detection elements.

The control unit may determine the thickness of the wearing layer from measurements, carried out with the sensor, of the distance between the sensor and the corresponding detection element.

If the entire energy chain or a part thereof slides over the sliding table, the individual sliding shoes are brought successively past the sensor. The respective wear of the individual sliding shoes may therefore be determined successively. If the movable end of the energy chain is moved regularly to and fro, the individual sliding shoes are brought correspondingly regularly past the sensor. Whenever a sliding shoe is brought past the sensor, the wear of this sliding shoe may be determined. In this way, the progression of the wear of the individual sliding shoes may be determined as a function of time.

The wear of the individual sliding shoes may be determined and output individually by the control unit. It is also possible merely that a respective warning is output as soon as the wear of one of the sliding shoes has exceeded a predetermined limit value. Such a warning may be output individually for each sliding shoe. As an alternative, it is possible that the control unit merely outputs a warning only as soon as the wear has exceeded the predetermined limit value for at least one of the sliding shoes.

It is also possible that only the wear of the sliding shoe with the greatest wear is determined. This means that only the greatest wear value is determined and output by the control unit. In that case, for example, a warning may be output as soon as the greatest wear has exceeded a predetermined limit value. Such a configuration is particularly simple and may be sufficient for many applications. For example, all the sliding shoes may be replaced as soon as the wear has exceeded a predetermined limit value for at least one of the sliding shoes. In this way, it is possible that, for example, an installation only needs to be shut down once in order to change the sliding shoes. Furthermore, the sliding of the energy chain on the sliding table may take place particularly smoothly if all the sliding shoes are worn approximately uniformly.

The control unit may be connected to the sensor by means of a cable or wirelessly. The control unit may moreover be connected by means of a cable or wirelessly to further electronic components in order to transmit information relating to the state of wear of the sliding shoes to them. For example, the control unit may transmit a signal to a process controller by radio if the process needs to be interrupted in order to replace one or more sliding shoes.

According to another preferred embodiment of the device, the sliding table is configured rigidly.

The sliding table is not part of the energy chain. In particular, the sliding table is not a lower run of the energy chain, on which an upper run of the energy chain could slide. In the present embodiment, this circumstance is expressed by the fact that the sliding table is configured rigidly. The sliding table thus cannot, in particular, be bent or otherwise modified by displacement of the movable end of the energy chain relative to the fixed end of the energy chain. Such modifiability does, however, exist for the energy chain. In the case of the energy chain, it may for example result from the fact that the energy chain is formed from a multiplicity of links connected to one another in an articulated fashion. In particular, the sliding table differs from the energy chain by the modifiability which is absent for the sliding table.

According to another preferred embodiment of the device, the sensor is arranged on, inside or below a sliding layer of the sliding table.

The sliding table has the sliding layer. The sliding layer is arranged on that surface of the sliding table on which the sliding shoes can slide. The distance between the detection element and the sensor may be measured contactlessly. Correspondingly, it is not a problem if there is material between the sensor and the surface of the sliding table, so long as this material does not prevent the measurement, for example because of a shielding effect.

According to another preferred embodiment of the device, the sensor is adapted to determine only the distance between the sensor and the detection element lying closest to the sensor at a particular instant.

In this embodiment, the wear of a sliding shoe may still be measured when this sliding shoe is being brought past the sensor. In order not to vitiate the measurement, the sensor may detect only a single detection element at a particular instant. This may, for example, be achieved by the sensor being configured in such a way that the sensor is sensitive only in a suitably limited spatial region, for example by the sensor having corresponding shield elements.

According to another preferred embodiment of the device, the sensor is adapted to determine the respective distance between the sensor and the detection elements perpendicularly to the sliding table.

The thickness of the wearing layer perpendicularly to the sliding surface is a suitable measure for the wear of a sliding shoe. Correspondingly, it is preferred for precisely this thickness to be determined. This is possible by measuring the distance between the sensor and the respective detection element perpendicularly to the sliding table. Such a measurement may, for example, be achieved by the sensor being sensitive only in a suitably limited spatial region, for example by the sensor having corresponding shield elements.

According to another preferred embodiment of the device, a fixed end of the energy chain is connected to the sliding table.

Starting from the sliding table, the energy chain begins with the fixed end and following on from this may form a lower run, a turnaround region and an upper run, which ends with the movable end of the energy chain. The upper run may slide entirely or partially on the sliding table. Depending on the setting of the energy chain, a turnaround region of the energy chain may also be formed following on directly from the fixed end of the energy chain.

According to another preferred embodiment of the device, a distance between the sensor and the fixed end of the energy chain corresponds at most to one third of a length of the sliding table.

If the sensor is arranged close enough to the fixed end of the energy chain, all the sliding shoes may be detected successively with the sensor. If the sensor were arranged too far away from the fixed end of the energy chain in the sliding table, only the sliding shoes close to the movable end of the energy chain could be brought past the sensor. For many applications, the sensor is arranged sufficiently close to the fixed end of the energy chain if the distance between the sensor and the fixed end of the energy chain corresponds at most to one third of the length of the sliding table.

The distance between the sensor and the fixed end is defined parallel to the surface of the sliding table. The length of the sliding table is intended to be understood as the extent of the surface of the sliding table which is available for the sliding shoes. The start and end of the length of the sliding table are thus determined by the positions of the first and last sliding shoes of the energy chain in the two extreme settings which the movable end of the energy chain can occupy.

According to another preferred embodiment of the device, a distance between the sensor and the fixed end of the energy chain lies in the range of between 0.8 and 1.2 m.

In this embodiment, it is preferred for the energy chain to have a length in the range of from 5 to 20 m.

According to another preferred embodiment of the device, the detection elements are formed from a metal.

Metals can be detected by means of various contactless measurement methods. Correspondingly, the distance between the sensor and a metal detection element may be determined by one of these methods.

Contactless measurements using magnetic materials are particularly accurate. Correspondingly, according to another preferred embodiment of the device, the detection elements are formed from a magnetic material.

According to another preferred embodiment of the device, the sensor is one of the following:
an inductive proximity switch,
a capacitive proximity switch,
a magnetic proximity switch,
an optical proximity switch,
an ultrasonic proximity switch.

A proximity switch may also be referred to as a proximity (approach) initiator, approach switch or proximity (approach) sensor. It is a sensor which reacts contactlessly when approached.

Inductive proximity switches react to both ferromagnetic and nonmagnetic metal objects. Capacitive proximity switches react to both metallic and nonmetallic objects. Magnetic proximity switches react to magnetic objects. In particular, a so-called reed switch or a Hall sensor may be envisioned as a magnetic proximity switch. Optical proximity switches react to light reflection from an object. Ultrasonic proximity switches evaluate the reflection of an ultrasound signal at an object as an obstacle.

In the case of the described device, the detection elements act as objects to be detected by the proximity switch.

As a further aspect of the invention, an arrangement which has a static first body, a second body which is movable relative thereto, and a device configured as described is proposed. A fixed end of the energy chain is connected to the first body via the sliding table.

As a further aspect of the invention, a control unit for a device configured as described is proposed. The control unit is adapted to determine a wear of the wearing layers of the sliding shoes from the measured values of the distance between the sensor and the detection elements.

As a further aspect of the invention, a computer program for a control unit configured as described is proposed. The computer program is adapted to determine a wear of the wearing layers of the sliding shoes from the measured values of the distance between the sensor and the detection elements.

As a further aspect of the invention, a machine-readable storage medium on which a computer program configured as described is stored is proposed.

The described particular advantages and configurational features of the described device may also be used and applied for the described arrangement, the described control unit, the described computer program and the described machine-readable storage medium, and vice versa.

The invention and the technical context will be explained in more detail below with the aid of the figures. It should be pointed out that the invention is not intended to be restricted by the exemplary embodiments shown. In particular, unless otherwise explicitly described, it is also possible to extract partial aspects of the situations explained in the figures and combine them with other component parts and information from the present description and/or figures. In particular, it should be pointed out that the figures, and in particular the size proportions represented, are only schematic. References which are the same denote objects which are the same, so that explanations from other figures may additionally be referred to where appropriate.

Figure 2:
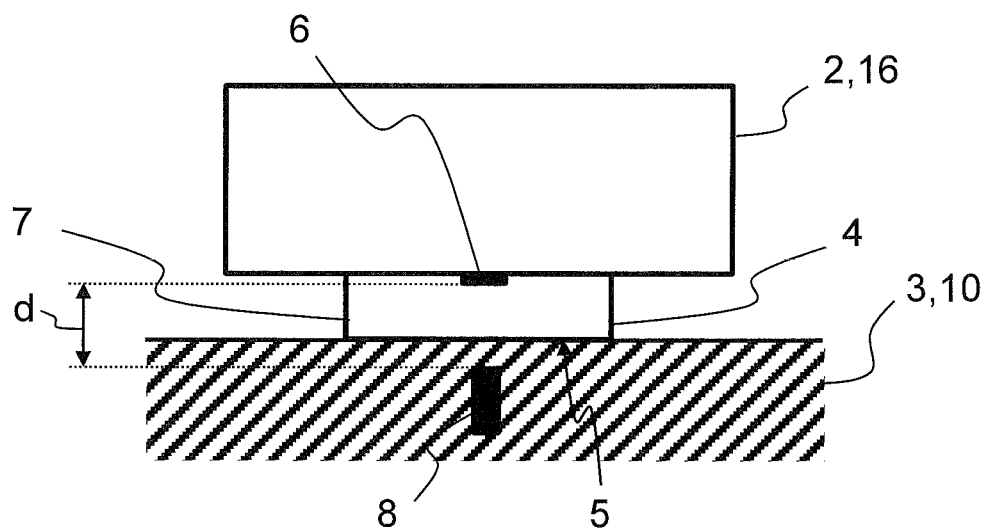

FIG. 1: shows a schematic side view of an arrangement according to the invention, FIG. 2: shows a more detailed schematic representation of a part of the arrangement of FIG. 1.

FIG. 1 shows an arrangement 13 comprising a static first body 14 and a second body 15, which is movable relative thereto. The arrangement 13 furthermore comprises a device 1. The device 1 comprises an energy chain 2 and a sliding table 3. The energy chain 2 can slide over the sliding table 3 by means of a plurality of sliding shoes 4. The sliding table 3 is configured rigidly. The energy chain 2 is formed by a multiplicity of links 16, which are connected to one another in an articulated fashion. By way of example, one of the links 16 is provided with a reference. A fixed end 11 of the energy chain 2 is connected to the first body 14 via the sliding table 3. A movable end 12 of the energy chain 2 is connected to the second body 15.

A sensor 8 is arranged inside the sliding table 3. In the embodiment shown, a distance s between the sensor 8 and the fixed end 11 of the energy chain 2 corresponds to less than one third of a length L of the sliding table 3 and lies in the range of between 0.8 and 1.2 m. The sensor 8 may, however, be arranged at any other position on the sliding table 3.

The sensor 8 is connected to a control unit 9 by means of a cable 17. A result determined by the control unit 9 may, as indicated, be transmitted by radio to a process controller, for example.

FIG. 2 shows a more detailed schematic representation of a part of the arrangement 13 of FIG. 1. A link 16 of the energy chain 2 is shown. Arranged on the link 16, there is a sliding shoe 4 with a sliding surface 5, via which the sliding shoe 4 is in contact with the surface of the sliding table 3 in the situation shown. A sliding layer 10 of the sliding table 3 is partially shown. The sliding surface 5 is the lower boundary of the sliding shoe 4 in the representation of FIG. 2.

The sliding shoe 4 has a detection element 6, which is arranged separated from the sliding surface 5 by a wearing layer 7. The detection element 6 is preferably formed from a magnetic metal. When using an inductive proximity switch, however, the detection element may for example also be formed from a nonmagnetic material.

The sensor 8 of the sliding table 3 is to determine a respective distance d between the sensor 8 and the detection elements 6. The sensor 8 is adapted to determine only the distance d between the sensor 8 and the detection element 6 lying closest to the sensor 8 at a particular instant. The sensor 8 is furthermore adapted to determine the respective distance d between the sensor 8 and the detection elements 6 perpendicularly to the sliding table 3. The sensor 8 may be an inductive, capacitive, magnetic or optical proximity switch or an ultrasonic proximity switch.

The control unit 9 shown in FIG. 1 is adapted to determine a wear of the wearing layers 7 of the sliding shoes 4 from the measured values of the distance d between the sensor 8 and the detection elements 6.

In the device 1 described, a sensor 8 with which a distance d from detection elements 6 in sliding shoes 4 of an energy chain 2 can be measured is integrated into a sliding table 3. The wear of the sliding shoes 4 may be deduced particularly simply and reliably therefrom.

LIST OF REFERENCES 1 device
2 energy chain
3 sliding table
4 sliding shoe
5 sliding surface
6 detection element
7 wearing layer
8 sensor
9 control unit
10 sliding layer
11 fixed end
12 movable end
13 arrangement
14 first body
15 second body
16 link
17 cable
d distance
s distance
L length

The invention claimed is:

1. A device comprising an energy chain and a sliding table, wherein the energy chain has a plurality of sliding shoes with a respective sliding surface for sliding on the sliding table, wherein the sliding shoes respectively have a detection element which is arranged separated from the sliding surface by a respective wearing layer, wherein the sliding table has a sensor for determining a respective distance (d) between the sensor and the detection elements, and wherein the sensor is a proximity switch.

2. The device as claimed in claim 1, furthermore having a control unit which is adapted to determine a wear of the wearing layers of the sliding shoes from measured values of the distance (d) between the sensor and the detection elements.

3. The device as claimed in claim 1, wherein the sliding table is configured rigidly.

4. The device as claimed in claim 1, wherein the sensor is arranged on, inside or below a sliding layer of the sliding table.

5. The device as claimed in claim 1, wherein the sensor is adapted to determine only the distance (d) between the sensor and the detection element lying closest to the sensor.

6. The device as claimed in claim 1, wherein the sensor is adapted to determine the respective distance (d) between the sensor and the detection elements perpendicularly to the sliding table.

7. The device as claimed in claim 1, wherein a fixed end of the energy chain is connected to the sliding table.

8. The device as claimed in claim 7, wherein the sensor is located at a distance (s) from the fixed end of the energy chain, wherein the distance (s) corresponds at most to one third of a length (L) of the sliding table.

9. The device as claimed in claim 7, wherein a distance (s) between the sensor and the fixed end of the energy chain lies in a range of between 0.8 and 1.2 m.

10. The device as claimed in claim 1, wherein the detection elements are formed from a metal.

11. The device as claimed in claim 1, wherein the detection elements are formed from a magnetic material.

12. The device as claimed in claim 1, wherein the proximity switch is one of the following:
an inductive proximity switch,
a capacitive proximity switch,
a magnetic proximity switch,
an optical proximity switch, and
an ultrasonic proximity switch.

* * * * *